United States Patent [19]

Kato

[11] Patent Number: 6,088,015
[45] Date of Patent: Jul. 11, 2000

[54] WAVEFORM GENERATOR

[75] Inventor: Toshiyuki Kato, Fujisawa, Japan

[73] Assignee: Matsushita Electric Industrial Co., Ltd., Osaka, Japan

[21] Appl. No.: 08/899,462

[22] Filed: Jul. 23, 1997

[30] Foreign Application Priority Data

Jul. 25, 1996 [JP] Japan .................................... 8-195888

[51] Int. Cl.$^7$ ..................................................... G09G 5/36
[52] U.S. Cl. ............................................ 345/134; 345/133
[58] Field of Search ..................................... 345/134, 133, 345/208, 10, 11, 12, 13, 14; 348/805, 806, 745–747, 177, 178, 181, 185; 315/370, 371, 368.23

[56] References Cited

U.S. PATENT DOCUMENTS

| | | | |
|---|---|---|---|
| 4,707,639 | 11/1987 | Truskalo . | |
| 5,016,095 | 5/1991 | Kii ............................................ | 358/64 |
| 5,298,985 | 3/1994 | Tsujihara et al. ........................ | 348/745 |
| 5,345,280 | 9/1994 | Kimura et al. ........................... | 348/745 |
| 5,455,492 | 10/1995 | Turnbull .................................. | 315/382 |
| 5,463,427 | 10/1995 | Kawashima .............................. | 348/806 |
| 5,565,744 | 10/1996 | Teuling et al. ...................... | 315/368.23 |
| 5,671,025 | 9/1997 | Ryu ......................................... | 348/745 |
| 5,675,523 | 10/1997 | Noda ....................................... | 364/607 |
| 5,828,358 | 10/1998 | Monta et al. ............................ | 345/133 |
| 5,841,487 | 11/1998 | Peters et al. ............................. | 348/805 |

FOREIGN PATENT DOCUMENTS

| | | |
|---|---|---|
| 61-151591 | 7/1986 | Japan . |
| 01191895 | 8/1989 | Japan . |
| 1-191895 | 8/1989 | Japan . |
| 4-114589 | 4/1992 | Japan . |
| 05037799 | 2/1993 | Japan . |
| 05056297 | 3/1993 | Japan . |
| 06268886 | 9/1994 | Japan . |

OTHER PUBLICATIONS

European search report for Int'l Appln No. EP97112587 dated May 21, 1999.

*Primary Examiner*—Amare Mengistu
*Assistant Examiner*—Jimmy Hai Nguyen
*Attorney, Agent, or Firm*—Ratner & Prestia

[57] ABSTRACT

A waveform generator generates a specified exponential function for converting a position signal corresponding to the position on the screen one by one to a corrected position signal thereby obtaining a waveform with shifted phase near the screen center compared to the original waveform. A conversion unit receives a position signal corresponding to the position on the screen one by one or the output of a second addition unit, a first addition unit for adding the output of the conversion means and an offset coefficient, a first multiplication unit for multiplying the output of the first addition unit and a frequency correction coefficient, a second addition unit for adding the position signal P and the output of the first multiplication unit, and a second multiplication means for multiplying the output of the conversion unit by an amplitude coefficient A. The position signal is input to the conversion unit and the first addition unit receives the output of the conversion unit. In the second step, the output of the second addition unit is input to the conversion unit, and the second multiplication unit receives the output of the conversion unit.

17 Claims, 5 Drawing Sheets

WAVEFORM GENERATOR

FIELD OF THE INVENTION

The present invention relates to the field of waveform generators for producing waveforms for operating CRT displays and, more particularly, to a waveform generator for producing a horizontal or vertical dynamic focusing voltage waveform.

BACKGROUND OF THE INVENTION

Devices as disclosed in Japanese Laid-open Patents S61-151591, H1-191895, and H4-114589 are well-known waveform generators for applying dynamic focusing voltage to CRTs.

FIG. 6 is a block diagram of the major parts of a waveform generator (dynamic focusing circuit) as disclosed in Japanese Laid-open Patent H1-191895 as an example of the waveform generator of the prior art. The prior art comprises a VCO (voltage control oscillator) 61, a binary counter 62, D/A (digital to analog) converter 63, multiplication unit 64, and amplifier 65.

Operation of the prior art is briefly explained with reference to FIG. 6. The conventional waveform generator employs the clock pulse from the VCO 61 to make the binary counter 62 count synchronizing to the scanning frequency. The D/A converter 63 receives the output of the binary counter 62 for producing a saw tooth wave.

Then, the multiplication unit 64 multiplies the signal, after removing the direct current component from the saw tooth wave, by its inverted signal to produce a parabolic waveform. The signal comprising a parabolic waveform produced by the waveform generator is output as the dynamic focusing voltage.

As described above, the waveform generator of the prior art, in general, employs a multiplication unit for converting a saw tooth wave synchronized to the scanning frequency to a signal comprising a parabolic waveform. The parabolic waveform signal which has its minimum value at the center is then amplified to generate a dynamic focusing voltage waveform.

With increasing flatness of a CRT display screen, the optimal dynamic focusing voltage waveform is tending towards being in proportion to the distance from the screen center raised for example to the 2.8th power, whereas a parabolic waveform, which has its minimum value at the center, is proportional to the square of the distance from the screen center.

Therefore, the waveform generator of the prior art which generally produces a parabolic waveform is becoming unsuitable for producing the optimal dynamic focusing voltage waveform for more recent, flat-screen CRTs. The prior art may fail to achieve the optimal focus characteristics over the entire screen. This is a first disadvantage of the prior art.

The output waveform produced by a waveform generator is usually several volts, but CRTs require several hundreds of volts as the dynamic focusing voltage waveform.

Accordingly, the signal produced by the waveform generator needs to be amplified for use by CRTs. To amplify the voltage at low cost, the focusing circuit of the prior art employs a transformer to increase the voltage and supply the increased dynamic focusing voltage waveform to the CRT.

The use of transformers, however, narrows the range of optimal frequency and phase characteristics of the focusing circuit. For example, if the focusing circuit employs a transformer which is satisfactory around the horizontal frequency of 100 kHz for amplifying the horizontal frequency around 30 kHz, the actual dynamic focusing voltage may become asymmetric even though the waveform generator outputs a symmetric waveform. Comparing the left (L) and right (R) from the center (C), as shown in FIG. 5, the actual dynamic focusing voltage has distorted asymmetric waveform.

Therefore the waveform generator of the prior art may produce a distorted dynamic focusing voltage waveform for some horizontal frequencies when it is required to process a broad range of horizontal frequencies such as the case with the latest CRT display monitors for computers.

The prior art may have difficulty in assuring the optimal dynamic focusing characteristics for the entire range of horizontal frequencies. This is the second disadvantage of the prior art.

SUMMARY OF THE INVENTION

The present invention employs a conversion unit which produces a dynamic focusing voltage waveform for CRTs.

The conversion unit converts a position signal corresponding to the position on the CRT screen to a converted signal which may be optimal dynamic focusing voltage for CRTs.

A waveform of the converted signal may require modification to correct deterioration or deformation of the waveform caused by the dynamic focusing output circuit applied used over a broad synchronizing frequency range.

For this purpose, the present invention employs a correction unit for selecting an appropriate constant for the conversion unit and correction unit itself, and thereby correcting the converted waveform, which is made by converting the position signal, to make a corrected position signal.

The corrected position signal is reconverted using the same conversion unit to produce the expected dynamic focusing voltage waveform. Thus, the waveform generator of the present invention enables the supply of an optimal dynamic focusing voltage waveform over a broad synchronizing frequency range.

BRIEF DESCRIPTION OF THE DRAWINGS

FIG. 1 (*b*) is a block diagram of a waveform generator in accordance with a second exemplary embodiment of the present invention.

DESCRIPTION OF THE PREFERRED EMBODIMENTS

First exemplary embodiment

FIG. 1(*a*) is a block diagram of a waveform generator in accordance with a first exemplary embodiment of the present invention.

The waveform generator of the present invention uses a position signal value px, offset coefficient −B, a coefficient F for correcting the scanning frequency, and an amplifying coefficient A for generating the dynamic focusing voltage waveform output. The present invention first prepares a saw tooth wave signal corresponding to the position on the screen for producing a dynamic focusing voltage waveform. This is hereafter called the position signal px.

Figure 1A:
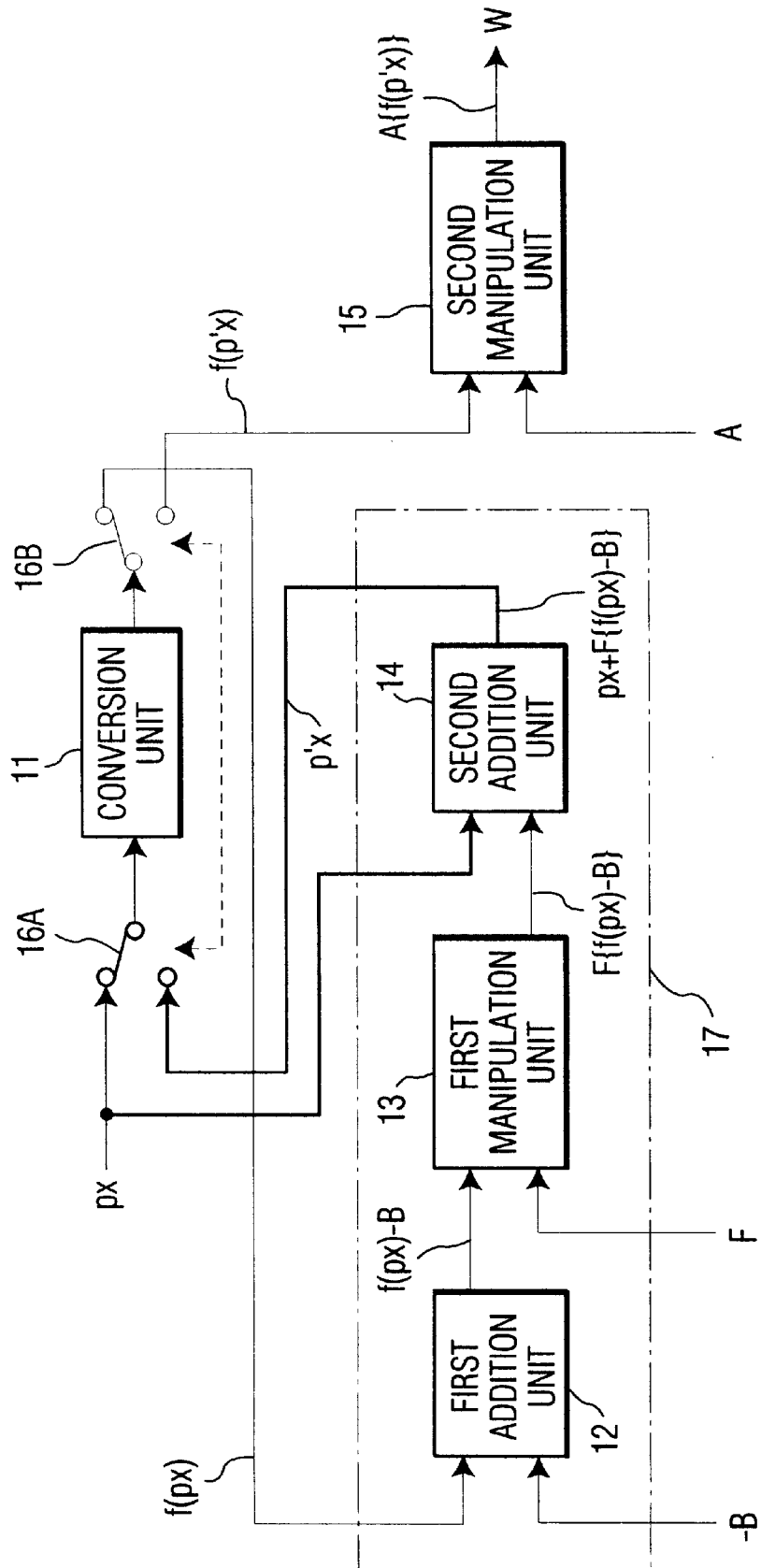
FIG. 1(*a*) is a block diagram of a waveform generator in accordance with a first exemplary embodiment of the present invention.
Figure 1B:
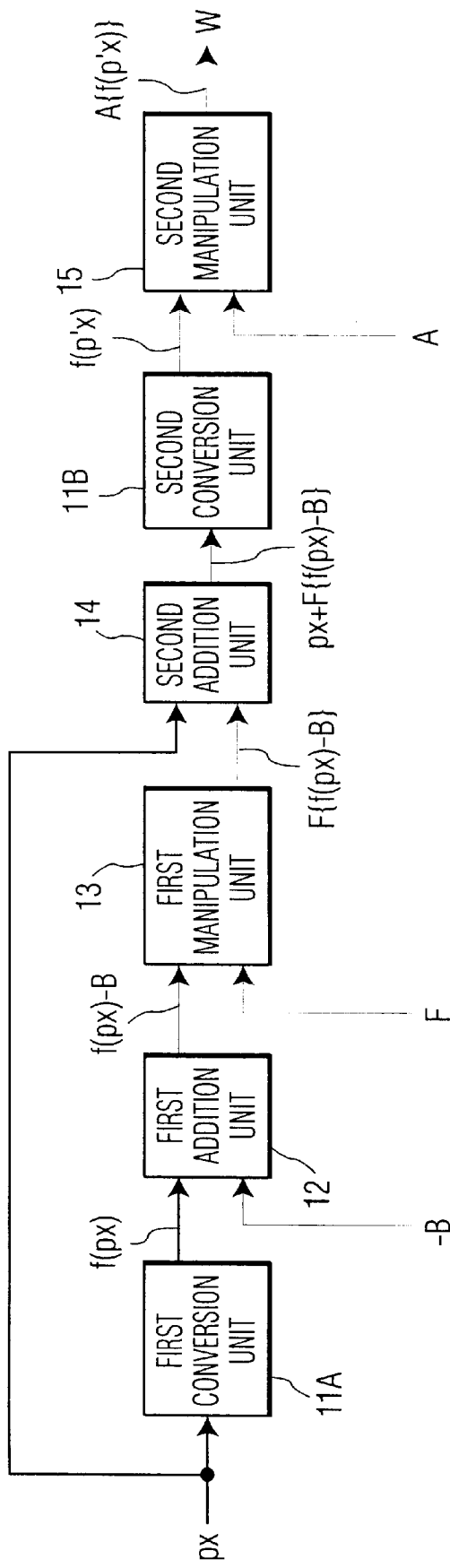

Configuration of the first exemplary embodiment is explained with reference to FIG. 1(a). The position signal px is input to a conversion unit 11 which generates a specified exponential function, for example $px^{2.8}$. A first addition unit 12 adds the output of the conversion unit 11 and the offset coefficient −B. A first multiplication unit 13 multiplies the output of the first addition unit 12 by the scanning frequency correcting coefficient F. A second addition unit 14 adds the output of the first multiplication unit 13 and the position signal px. The conversion unit 11 again receives the output of the second addition unit 14. A second multiplication unit 15 then multiplies the output of the conversion unit 11 by the amplitude coefficient A. The addition unit 12, first multiplication unit 13, and second addition unit 14 form a correction unit 17.

Switches 16A and 16B are provided to inter-switch the input and output of the conversion unit 11. When the position signal px is input to the conversion unit 11, the first addition unit 12 receives the output of the conversion unit 11. When the output of the second addition unit 14 is input to the conversion unit 11, the second multiplication unit 15 receives the output of the conversion unit 11.

The position signal px is obtainable from a saw tooth wave produced by a digital binary counter, as in the prior art. It can alternatively be obtained by converting the waveform of a saw tooth wave, which linearly decrease or increase during CRT scanning, to a digital signal using an A/D converter.

The position signal corresponds to the scanning position (or data point) x on the screen. The position signal has the minimum value −P at the starting edge on the screen, 0 at the screen center, and the maximum value +P at the ending edge of the screen.

The scanning position (or data point) x takes a value −n at the starting edge of the screen, 0 at the screen center, and n at the ending edge of the screen. In other words, the center value of the saw tooth wave corresponds to the screen center.

The position signal at each data point x (−n . . . −1, 0, 1, . . . n) is set as px.

The position signal px is input to the conversion unit 11, and the conversion unit 11 outputs a corresponding functional value f(px) to the first addition unit 12. The px is considered to be a normalized value because the value of the position signal px later becomes the basis for correction and amplification before output.

To support f(0)=0, f (−P)=f(+P), the input signal of the conversion unit is converted to an absolute value at an input unit of the conversion unit 11 so that the conversion unit 11 always conducts operation on a positive input value.

The conversion unit 11 comprises a memory for storing function values. This memory desirably employs the input signal as a variable and stores values in a part of the first quadrant near the origin of settable exponential function and those mirrored to the second quadrant symmetrical to the axis.

In other cases the conversion unit comprises an absolute value circuit for converting the input value to an absolute value and a memory for storing that function values in a part of the first quadrant near the origin of a specified exponential function which employs the input signal converted to an absolute value as a variable.

The first addition unit 12 and the second addition unit 14 can be either a digital adder or an analog processor having a D/A converter unit.

In the same way, a first multiplication unit 13 and a second multiplication unit 15 can be a digital multiplier or an analog multiplier, if the addition unit is configured with an analog circuit. Likewise, addition unit and multiplication unit can be configured in required combinations.

Figure 3:
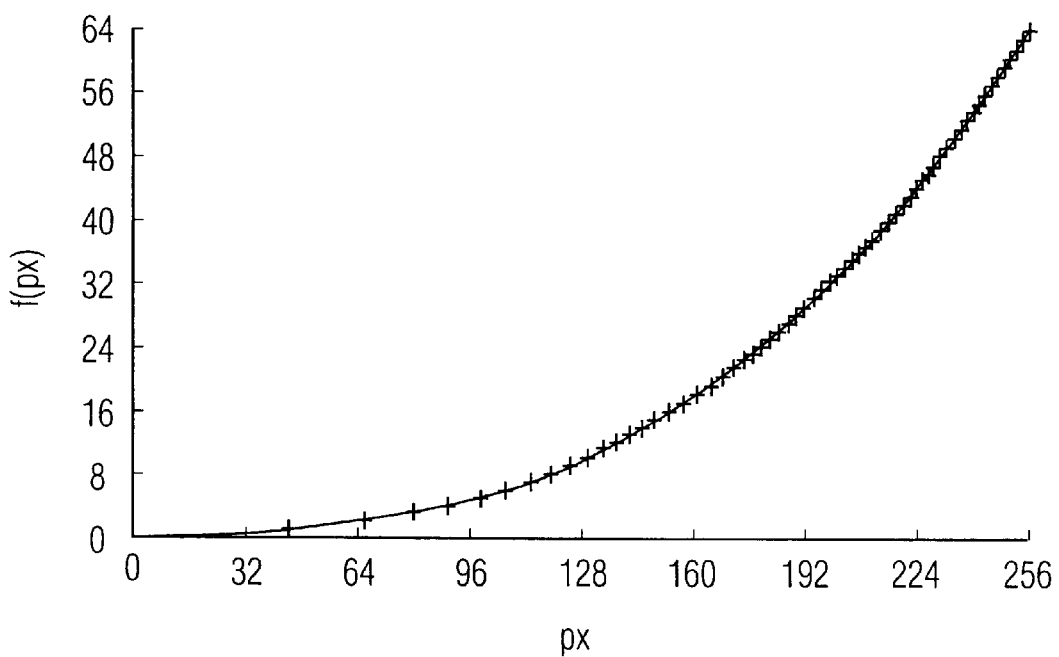
FIG. 3 is a graph illustrating an example of characteristics of a conversion unit 11.

Table 1 is an example of the conversion unit 11 having the exponent 2.8 when P=253 and f(±P)=63. FIG. 3 is a graph illustrating the values in Table 1.

| px  | f(px) | px  | f(px) | px  | f(px) | px  | f(px) |
| --- | ----- | --- | ----- | --- | ----- | --- | ----- |
| 0   | 0     | 155 | 16    | 199 | 32    | 230 | 48    |
| 58  | 1     | 158 | 17    | 201 | 33    | 231 | 49    |
| 74  | 2     | 162 | 18    | 203 | 34    | 233 | 50    |
| 85  | 3     | 165 | 19    | 205 | 35    | 235 | 51    |
| 95  | 4     | 168 | 20    | 207 | 36    | 236 | 52    |
| 102 | 5     | 171 | 21    | 209 | 37    | 238 | 53    |
| 109 | 6     | 174 | 22    | 211 | 38    | 239 | 54    |
| 115 | 7     | 177 | 23    | 213 | 39    | 241 | 55    |
| 121 | 8     | 179 | 24    | 215 | 40    | 243 | 56    |
| 126 | 9     | 182 | 25    | 217 | 41    | 244 | 57    |
| 131 | 10    | 184 | 26    | 219 | 42    | 246 | 58    |
| 136 | 11    | 187 | 27    | 221 | 43    | 247 | 59    |
| 140 | 12    | 189 | 28    | 223 | 44    | 249 | 60    |
| 144 | 13    | 192 | 29    | 224 | 45    | 250 | 61    |
| 148 | 14    | 194 | 30    | 226 | 46    | 252 | 62    |
| 152 | 15    | 196 | 31    | 228 | 47    | 253 | 63    |

The offset coefficient −B is pre-input to the first addition unit 12.

The output of the first addition unit 12 is $$f(px) - B$$

This is input to the multiplication unit 13. The coefficient F is pre-input to the multiplication unit 13 as the scanning frequency correction coefficient. The results of multiplication by the multiplication unit 13 is $$F\{f(px) - B\}$$

This is input to the second addition unit 14.

The aforementioned normalized value px is also input to the second addition unit 14. The output of the second addition unit 14 is $$px + F\{f(px) - B\}$$

This formula indicates that a position correction value $$F\{f(px) - B\}$$

is added to the original normalized position signal px. If B=f(±P), the position correction value $$F\{f(px) - B\}$$

becomes 0 at the starting and ending edges of the screen, and the minimum value at the screen center. In other words, it can be understood that the largest delay in the phase occurs at the screen center compared to the original position signal px. This is defined as a corrected position signal:

$$p'x = px + F\{f(px) - B\}$$

The corrected position signal p'x is input to the conversion unit 11 again, and the conversion unit 11 outputs the function value f(p'x). This is input to the multiplication unit 15. Table 2 shows an example of details of operation up to this point.

TABLE 2

An example of conversion and calculation
(When B = 63 and F = 0.77)

| x | px | abs(px) | f(abs(px)) | f(px) − B | F(f(px) − B) | p'x | abs(p'x) | f(abs(p'x)) |
|---|-----|-----|----|-----|-----|------|-----|----|
| 1 | −255 | 255 | 64 | 1 | 1 | −254 | 254 | 64 |
| 2 | −220 | 220 | 43 | −20 | −16 | −236 | 236 | 52 |
| 3 | −185 | 185 | 26 | −37 | −28 | −213 | 213 | 39 |
| 4 | −150 | 150 | 15 | −48 | −37 | −187 | 187 | 27 |
| 5 | −115 | 115 | 7 | −56 | −43 | −158 | 158 | 17 |
| 6 | −80 | 80 | 3 | −60 | −47 | −127 | 127 | 9 |
| 7 | −45 | 45 | 1 | −62 | −48 | −93 | 93 | 4 |
| 8 | −10 | 10 | 0 | −63 | −49 | −59 | 59 | 1 |
| 9 | 25 | 25 | 0 | −63 | −48 | −23 | 23 | 0 |
| 10 | 60 | 60 | 1 | −62 | −48 | 12 | 12 | 0 |
| 11 | 95 | 95 | 4 | −59 | −45 | 50 | 50 | 1 |
| 12 | 130 | 130 | 10 | −53 | −41 | 89 | 89 | 3 |
| 13 | 165 | 165 | 19 | −44 | −34 | 131 | 131 | 10 |
| 14 | 200 | 200 | 33 | −30 | −23 | 177 | 177 | 23 |
| 15 | 235 | 235 | 51 | −12 | −9 | 226 | 226 | 46 |
| 16 | 255 | 255 | 64 | 1 | 1 | 256 | 256 | 65 |
| 16 | 270 | 270 | 76 | 13 | 10 | 280 | 280 | 83 |

The constant A is pre-input to the multiplication unit 15 as an amplitude coefficient, and the multiplication unit 15 outputs the result of multiplication: Af(p'x). This is the dynamic focusing output:

$$W = Af(p'x) = Af[px + F\{f(px) - B\}]$$

If the scanning frequency correction coefficient F is 0, W=Af (px). This is merely the amplitude of a specified exponential waveform set in the conversion unit 11 multiplied by the amplitude coefficient A.

Therefore, the first exemplary embodiment of the present invention solves the first disadvantage of the waveform generator of the prior art previously described. More specifically, the first exemplary embodiment enables the generation of an ideal dynamic focusing voltage waveform for increasingly flat CRT display monitors for which compensation using a parabolic waveform has become difficult.

When the scanning frequency correction coefficient F increases, the dynamic focusing output W deforms, generating the largest delay in the phase at the screen center due to the effect of the corrected position signal p'x.

Thus, the first exemplary embodiment of the present invention solves the second disadvantage of the waveform generator of the prior art previously described by controlling the scanning frequency correction coefficient F. In other words, the distortion of a waveform which is a problem caused by the employment of a low-cost transformer in the prior art can be corrected optimally.

As explained above, the waveform generator of the present invention solves the first disadvantage of the prior art by employing the function in which the exponent can be specified for producing the ideal dynamic focusing voltage waveform required for recent CRT display monitors which are becoming difficult to satisfy using a parabolic waveform.

Furthermore, the waveform generator of the present invention is capable of optimizing correction by selecting an appropriate constant: A, B, or F for processors, which solves the second disadvantage of the prior art: that is, distortion of waveform caused by the dynamic focusing output circuit which has deficient frequency and phase characteristics.

Figure 4:
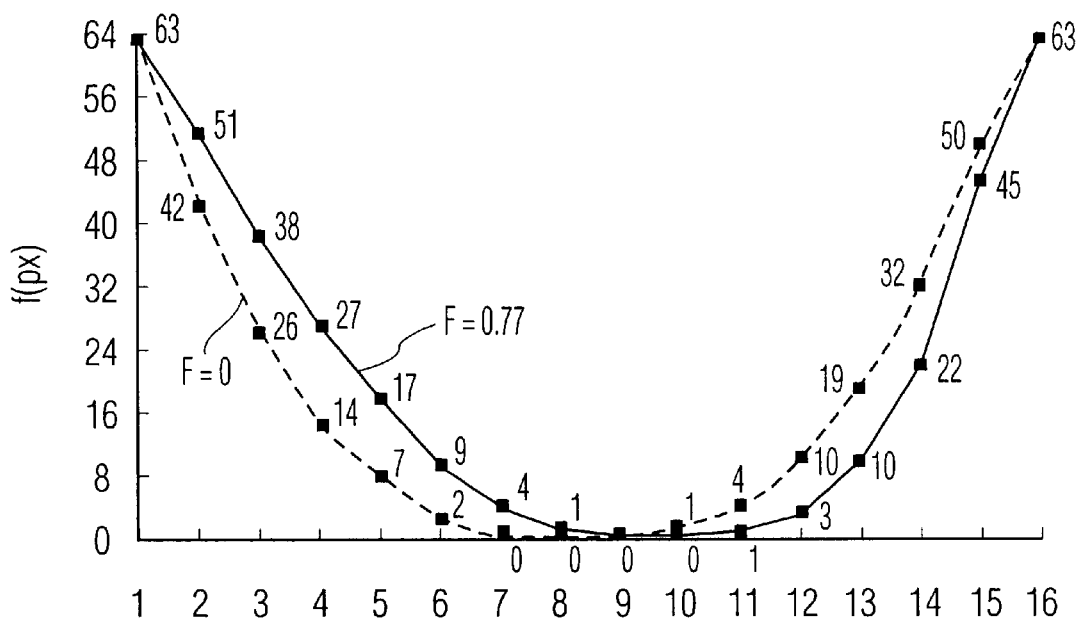
FIG. 4 is a graph illustrating exemplary waveforms.
Figure 5:
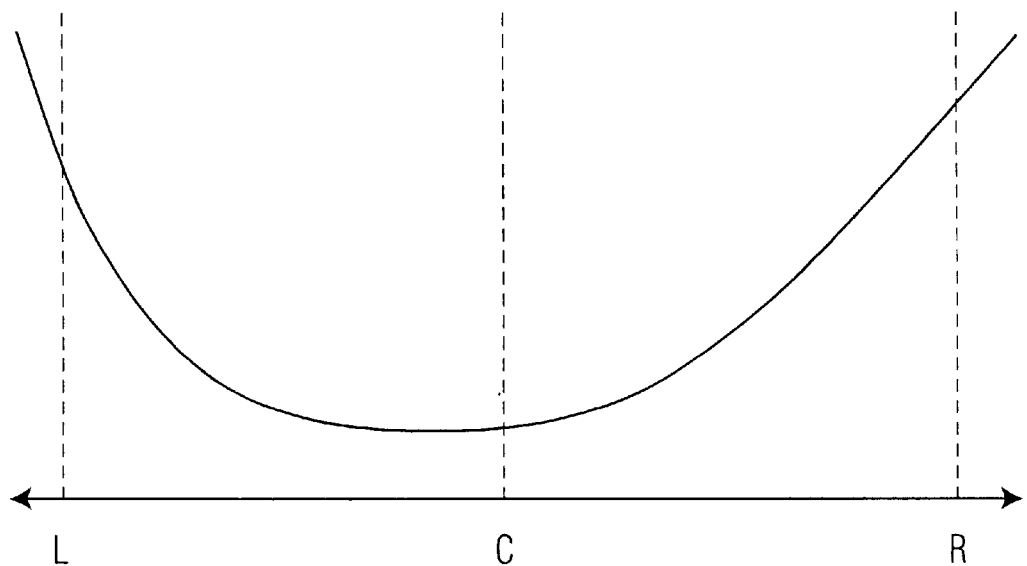
FIG. 5 is an example of a focusing output with unfavorable frequency and phase characteristics.
Figure 6:
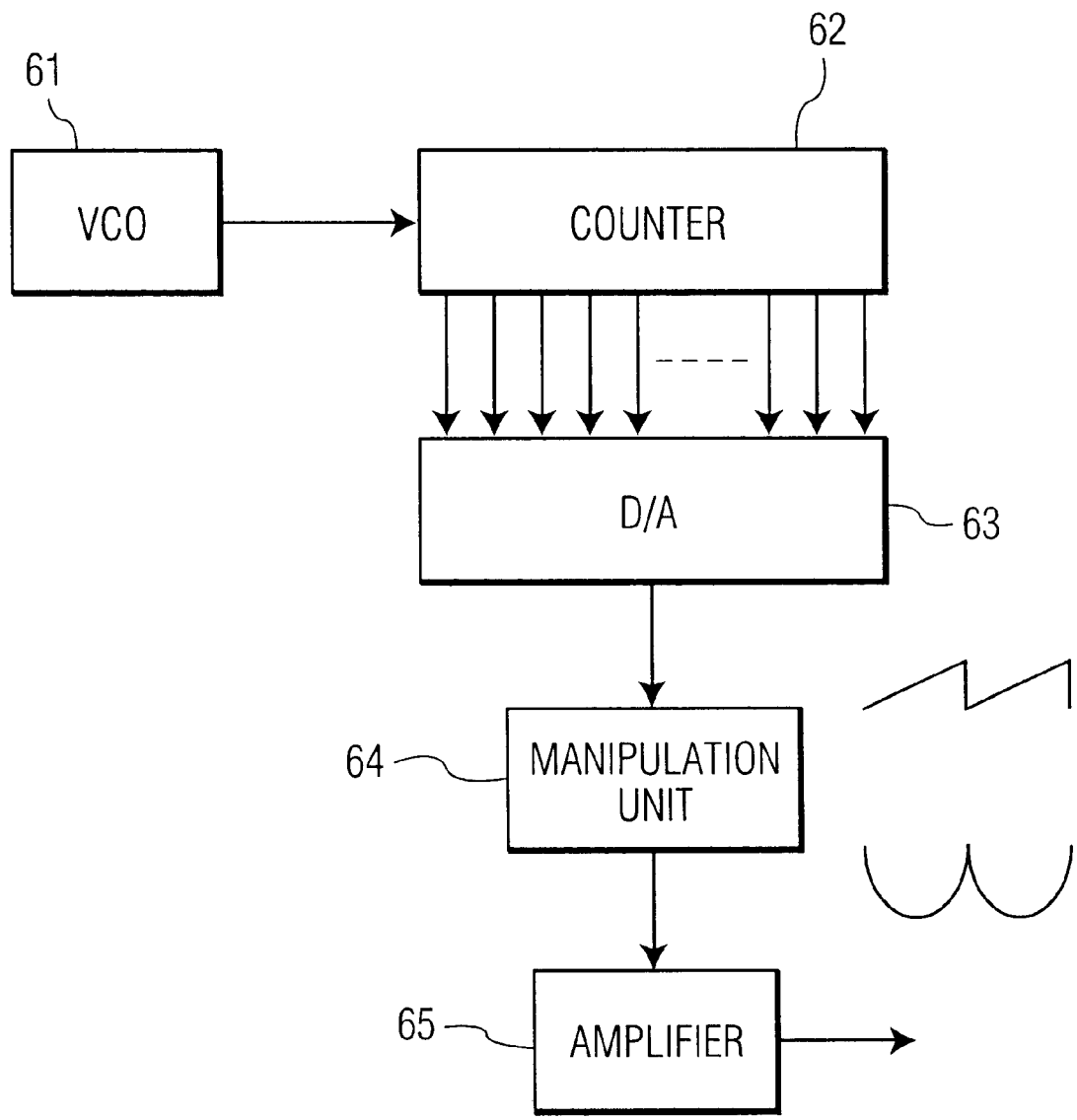
FIG. 6 is a block diagram of a waveform generator in accordance with the prior art.

FIG. 4 shows an example of changes in the dynamic focusing output waveform when the value F is changed. When F=0, the waveform is inclined towards the left. On the other hand, when F=0.77, the waveform is inclined to the right. The waveform generator of the present invention thus enables the cancellation of any distortion generated by the dynamic focusing output circuit by generating signals with such waveform. Furthermore, a waveform which is desirably bisymmetrical is obtained. As shown, it is preferred that the curve minimum coincide with the x-axis.

Second exemplary embodiment

The coefficients A, B and F can be pre-input to the first addition unit 12, the first and the second multiplication unit 13, 15 using hard-wiring or reading them stored in a memory. The coefficients A, B and F can be determined by picture quality determination experiments changing values of the coefficients.

In the above explanation, the input and output of single conversion unit 11 are switched. However, it is also possible to provide two conversion unit 11A and 11B with the same function (or two different functions) as in FIG. 1B.

Third exemplary embodiment

A third exemplary embodiment of the present invention is explained with reference to a block diagram of FIG. 2.

The first and second exemplary embodiments were explained referring to a hardware circuit configuration. The third exemplary embodiment may be implemented, for example, using a CPU.

In the waveform generator according to the third exemplary embodiment of the present invention, a ROM 21 for storing function data, a RAM 23 for storing waveform data, and a CPU 24 for processing are connected to a bus 20. The RAM 23 receives the output of a counter 22 which is initialized by the synchronizing signal S. A D/A converter 25 receives the output of the RAM 23.

The CPU 24 calculates the focusing voltage waveform data corresponding to the position on the screen using the function data previously stored in the ROM 21, and the result thereof is stored in the RAM 23.

The counter 22 reads out the waveform data corresponding to the position on the screen from the RAM 23, and causes to output the dynamic focusing voltage waveform.

An offset coefficient −B, scanning frequency correction coefficient F, and amplitude coefficient A are stored in the internal register of the CPU 24, ROM 21 or RAM 23 illustrated, or other memory not illustrated in the figure. Needless to say, the CPU 24 may conduct more than one addition and multiplication processing.

The functions ROM 21, RAM 23, and CPU 24 may be combined in alternative arrangements. For example, the function data can be stored in a part of fixed program area in the CPU instead of using the ROM 21. The RAM can be substituted with a part of the main storage in the CPU. The counter 22 can also be replaced with a DMA controller. The equivalent function can also be realized by using a part of the main storage as the ROM 21 and RAM 23, and function data is transferred by processing of the CPU 24.

Figure 2:
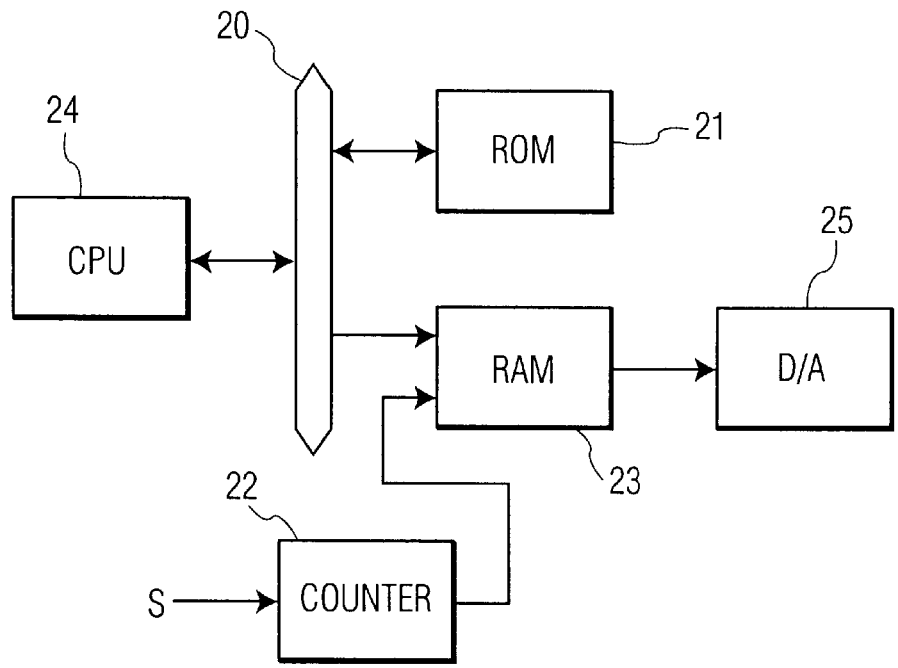
FIG. 2 is a block diagram of a waveform generator in accordance with a third exemplary embodiment of the present invention.

In FIG. 2, a so-called refresh memory is configured by continuously reading out data in a specified storage area of the RAM 23 by the counter 22. The synchronizing signal S initializes the counter 22 for keeping the readout timing. The CPU 24 sets the dynamic focusing voltage waveform data to the specified storage area of the RAM 23.

More specifically, the CPU 24 first produces a position signal px corresponding to the scanning position x on the screen, which has the minimum value −P at the stating edge of the screen, 0 at the screen center, and the maximum value +P at the ending edge of the screen.

Next, the CPU 24 reads out the function data f(px) stored in the ROM 21 based on the position signal px. The CPU 24 then calculates the corrected position signal p'x=F{f(px) −B} using the offset coefficient −B and the scanning frequency correction coefficient F. Consequently, the original normalized position signal px and the position correction value F{f(px) −B} are added to obtain p'x=px+F{f(px) −B}. As already explained in the first exemplary embodiment, it can be understood that the corrected position signal p'x causes the largest phase delay at the screen center compared to the original position signal px.

Then, the CPU 24 reads out the function data f(p'x) stored in the ROM 21 based on the corrected position signal p'x, and calculates the dynamic focusing output W=Af(p'x)=Af [px+F{f(px) −B}] using the amplitude coefficient A.

The CPU 24 then writes a calculated value to the RAM 23.

By repeating this operation, a series of dynamic focusing output data is completed in the specified area of the RAM 23.

As explained above, the waveform generator of the present invention employs the function in which the exponent can be specified for solving the first disadvantage of the prior art. More specifically, the present invention enables the generation of an ideal dynamic focusing voltage waveform for the latest CRT display monitors which are becoming difficult to fully compensate using a parabolic waveform.

Furthermore, in the waveform generator of the present invention, appropriate constants A, −B, and F for processors are selectable as required for solving the second disadvantage of the prior art. More specifically, distortion caused by the dynamic focusing output circuit which has deficient frequency and phase characteristics can be corrected optimally by selecting appropriate constants A, −B, and F.

FIG. 4 is an example of change in the dynamic focusing output waveform when a value of the constant F is changed. When F=0, the waveform is inclined towards the left, and when F=0.77, the waveform is inclined towards the right. The waveform generator of the present invention thus enables the cancellation of any distortion caused by the dynamic focusing output circuit by generating signals with such waveform.

The third exemplary embodiment of the present invention can solve the first and second disadvantages of the prior art as explained in the first exemplary embodiment. In addition, the waveform generator of the third exemplary embodiment can be realized by the use of a part or all of the CPU, ROM, and RAM for controlling the entire CRT display monitor. Thus, the third exemplary embodiment offers a low-cost CRT display monitor with optimal focusing performance.

Accordingly, the present invention solves a problem of a waveform generator which produces a dynamic focusing waveform not suitable for CRTs requiring non-parabolic waveform, and cancels distorted frequency and phase characteristics of the output circuit. The present invention realizes a waveform generator which assures high-quality dynamic focusing characteristics.

In the exemplary embodiments, an example of the employment of exponential function is explained in detail. The type of function is naturally selected in accordance with the characteristics of CRT displays. It will be recognized that other types of functions may be employed in accordance with the present invention. The exemplary embodiments are also explained with the precondition that the dynamic focusing voltage waveform is applied to the CRT in the horizontal deflecting direction. It will be appreciated that the same effect is achieved by applying the waveform in the vertical direction. The exemplary embodiments are also explained with the precondition of the use of a digital signal and digital circuit. It will also be appreciated that the present invention can be realized with the use of an analog signal and an analog circuit.

The exemplary embodiments described herein are therefore illustrative and not restrictive. The scope of the invention being indicated by the appended claims and all modifications which come within the true spirit of the claims are intended to be embraced therein.

What is claimed is:

1. A waveform generator for generating a focusing waveform for use with a display, comprising:

conversion means for receiving a position signal corresponding to screen position on said display and for applying a first bisymmetric function to said position signal to obtain a modified signal;

correction means for adding a correction to said modified signal to obtain a corrected modified signal;

said conversion means further for applying a second bisymmetric function to said corrected modified signal so that said focusing waveform is received by said display wherein said first bisymmetric function and said second bisymmetric function each provide an at least substantially bisymmetrical output.

2. A waveform generator in accordance with claim 1, wherein said corrected modified signal is transmitted to said conversion means so that one of said specified function and a further function is applied to said corrected modified signal and wherein said corrected modified signal with said one of said specified function and said further function applied is provided to said coupler.

3. A waveform generator in accordance with claim 1, wherein a first switch and a second switch are provided before and after said conversion means, respectively for selecting input and output for said conversion means.

4. A waveform generator in accordance with claim 1, wherein said correction means includes:

first addition means for adding said modified signal and an offset coefficient;

first multiplication means for multiplying the output of said first addition means by a scanning frequency correction coefficient; and second addition means for adding the output of said first multiplication means and the position signal to obtain said corrected modified signal.

5. A waveform generator in accordance with claim 4, comprising a second multiplication means for multiplying said corrected modified signal by an amplitude coefficient to obtain said focusing waveform.

6. A waveform generator in accordance with claim 1, wherein said corrected modified signal after said second function is applied is said focusing waveform.

7. A waveform generator in accordance with claim 1, further comprising:

further conversion means for receiving said corrected modified signal from said correction means and for applying one of said first function and said second function to said corrected position signal to obtain a further position signal; and a further coupler for transmitting said further position signal towards said display so that said focusing waveform is received by said display.

8. A waveform generator as defined in claim 7, wherein said conversion means converts an absolute input value using said first function.

9. A waveform generator as defined in claim 7, wherein said conversion means comprises storage means for storing values which are a part of the first quadrant of said first function mirrored to the second quadrant symmetrical to an axis.

10. A waveform generator as defined in claim 1, wherein said first function is the exponential function.

11. A waveform generator as defined in claim 7, wherein said conversion means comprises storage means for storing values which are a part of the first quadrant of said first bisymmetric function mirrored to the second quadrant symmetrical to a vertical axis.

12. A waveform generator as defined in claim 8, wherein said first function is an exponential function.

13. A waveform generator according to claim 1, wherein said first function and said second function are the same and are applied by a common device.

14. A waveform generator comprising:

a first memory having a function data corresponding to a bisymmetrical output;

a counter for sequentially counting screen position;

a second memory for sequentially outputting data which is synchronized to the output of said counter; and a processor which produces a corrected position signal by adding and multiplying the function data read out from said first memory using preset position information corresponding to each position on the screen, an offset coefficient, and a scanning frequency correction coefficient; said corrected position signal is used for reading out the function data from said first memory again so as to produce an at least substantially bisymmetrical dynamic focusing output data by multiplying said function data by an amplitude coefficient; and said dynamic focusing output data is written to said second memory.

15. A method of generating a focusing waveform for a display, comprising the steps of:

applying a predetermined function to a position signal which corresponds to respective screen positions of said display to obtain a corrected position signal;

performing a plurality of mathematical corrections to said corrected position signal; and performing at a least one of said predetermined function and a further function to said corrected position signal to obtain said focusing waveform, wherein said predetermined function and said further function provide an at least substantially bisymmetrical output.

16. A method for generating a focusing waveform for use with a display, comprising the steps of:

applying a first bisymmetric function to a position signal corresponding to screen position on said display to obtain a modified signal;

adding a correction to said modified signal;

applying a second bisymmetric function to said corrected modified signal;

wherein said first bisymmetric function and said second bisymmetric function each provide an at least substantially bisymmetrical output.

17. A method for generating a focusing waveform according to claim 16, wherein said first function and said second function are the same and are applied by a common device.

* * * * *

UNITED STATES PATENT AND TRADEMARK OFFICE
CERTIFICATE OF CORRECTION

PATENT NO. : 6,088,015
DATED : July 11, 2000
INVENTOR(S) : Kato

It is certified that error appears in the above-identified patent and that said Letters Patent is hereby corrected as shown below:

Column 8,
Line 66, delete "specified" and insert -- first bisymmetric --.
Line 67, delete "a further" and insert -- said second bisymmetric --.

Column 9,
Lines 1-3, delete "and wherein said corrected modified signal with said one of said specified function and said further function applied is provided to said couple".
Lines 32-35, delete "; and a further coupler for transmitting said further position signal towards said display so that said focusing waveform is received by said display".

Column 10,
Lines 5, 12, 25, 30 and 31, before "function" insert -- bisymmetric --.

Signed and Sealed this

Twelfth Day of November, 2002

Attest:

Attesting Officer

JAMES E. ROGAN
*Director of the United States Patent and Trademark Office*